United States Patent [19]

Shurboff et al.

[11] Patent Number: 5,525,204
[45] Date of Patent: Jun. 11, 1996

[54] METHOD FOR FABRICATING A PRINTED CIRCUIT FOR DCA SEMICONDUCTOR CHIPS

[75] Inventors: John Shurboff; Ang L. Eng, both of Singapore, Singapore

[73] Assignee: Motorola, Inc., Schaumburg, Ill.

[21] Appl. No.: 315,049

[22] Filed: Sep. 29, 1994

[51] Int. Cl.⁶ .................................................. C25D 5/02
[52] U.S. Cl. ...................... 205/125; 29/843; 228/180.22
[58] Field of Search ............................ 427/96; 205/125; 429/843; 228/180.22

[56] References Cited

U.S. PATENT DOCUMENTS

| | | | |
|---|---|---|---|
| 4,946,563 | 8/1990 | Yeatts | 205/125 |
| 5,194,137 | 3/1993 | Moore | 205/125 |
| 5,302,492 | 4/1994 | Ott | 430/314 |
| 5,316,788 | 5/1994 | Dibble | 427/98 |

OTHER PUBLICATIONS

Raymond H. Clark, *Handbook of Printed Circuit Manufacturing* Van Nostrand Reinhold Co. New York (1985) month unavailable pp. 3–8.

*Primary Examiner*—John Niebling
*Assistant Examiner*—Brendan Mee
*Attorney, Agent, or Firm*—Gary J. Cunningham; Daniel R. Collopy

[57] ABSTRACT

Fabricating a printed circuit by forming layers of metallization in a predetermined sequence, where each layer is formed in a predetermined pattern, with a layer of plating formed at selected locations of the printed circuit. Subsequently, forming a layer of insulation over the layers of metallization, except at the selected locations.

15 Claims, 4 Drawing Sheets

-PRIOR ART-

METHOD FOR FABRICATING A PRINTED CIRCUIT FOR DCA SEMICONDUCTOR CHIPS

FIELD OF THE INVENTION

This invention relates in general to fabricating printed circuits, and in particular to fabricating printed circuits for direct chip attach (DCA) semiconductor chips.

BACKGROUND OF THE INVENTION

In portable communication products such as selective call receivers and cellular telephones, a consumer need for smaller, compact products, has led to a constant challenge among manufacturers to pack more features into smaller packages. In most of these products a printed circuit board (PCB) is used to provide interconnections between devices and components. With the reduction in the size of these communication products, the density of components and devices mounted on a PCB has increased. Consequently, the density of connections on a PCB has increased significantly. Recently, a new method commonly known as direct chip attach (DCA) or flip chip on board (FCOB), has been developed. Using this method, a semiconductor chip is mounted directly to a PCB i.e. the semiconductor chip is flipped over and the bond pads of the semiconductor chip are soldered onto a matching footprint of pads on the PCB. There are several requirements that must be met by a PCB manufacturer when fabricating a PCB for DCA. These requirements include providing a controlled volume of eutectic tin-lead solder on each pad of the flip chip footprint to allow for high yield production and reliable flip chip joints. The volume and the consistency of eutectic solder on the PCB required for forming the flip chip joints between the flip chip and the PCB is greater than can be deposited using conventional methods, i.e., hot air solder leveling or controlled electrolytic plating. A method has been developed for depositing solder for the flip chip on a PCB which meets the above requirements. With this method fabricating a PCB comprises the conventional steps of drilling, depositing electroless copper, imaging, applying plating resist, plating, stripping plating resist, etching, and finally applying the solder mask, to form a pattern of metallization on a substrate. Subsequent, to these steps, a secondary process forms the solder deposits. The secondary process comprises the steps of applying plasma to the surface of the solder mask, to prepare the surface of the solder mask depositing a layer of copper over the solder mask to electrically couple the pattern of metallization on the substrate applying a layer of plating resist over the layer of copper at selected locations of the pattern of metallization depositing plating at the selected locations removing the plating resist stripping the deposited layer of copper reflowing the printed circuit causing the deposits at the selected locations to form solder bumps, and finally, flattening the solder bumps to form a level set of contact locations which align with the bond pads of an inverted semiconductor chip. A disadvantage of this method is, since the solder mask is applied before this secondary process is performed, the solder mask is exposed to each of these steps either directly or indirectly, thus, adversely affecting the quality and the reliability of the solder mask.

The plasma step roughens the surface of the solder mask which, although necessary to improve the adhesion of the layer of copper to the solder mask, degrades the solder mask making it susceptible to reliability problems. In addition, the plasma step is a difficult process to control to achieve a critical balance between a desired degree of roughness of the surface of the solder mask, and ensuring sufficient solder mask remains on the printed circuit. In addition, due to the cost of plasma, the plasma step is an expensive step. Further, in the copper removal step, the copper is stripped from the surface of the solder mask by etching. This step exposes the solder mask to the etching process and further contributes to weakening the solder mask.

Hence, it can be seen that a need exists for an economical and reliable method for fabricating printed circuits for semiconductor chips which does not degrade the solder mask and, preferably, does not require the use of plasma.

SUMMARY OF THE INVENTION

In carrying out the objects of the present invention in one form, there is provided a method for fabricating a printed circuit that improves the reliability of the printed circuit and reduces the cost of fabrication by applying a solder mask in a final process after a plating process, thereby preventing the solder mask from being exposed to the plating processes and preserving the quality of the solder mask, thus, improving the reliability of the printed circuit.

DETAILED DESCRIPTION OF THE INVENTION

Figure 1:
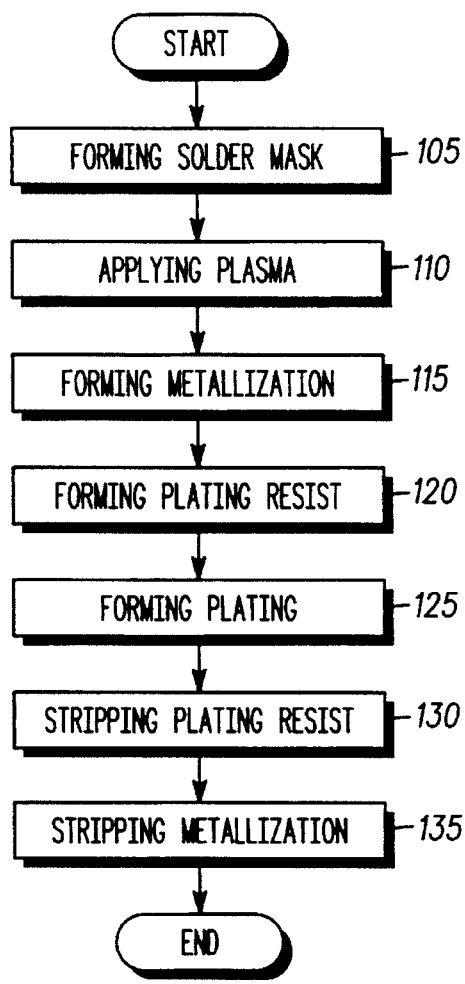
FIG. 1 illustrates a flowchart for fabricating a printed circuit in accordance with the prior art.
Figure 2:
FIGS. 2–8 illustrate a cross sectional view of a printed circuit at various stages during fabrication in accordance with the prior art.
Figure 3:
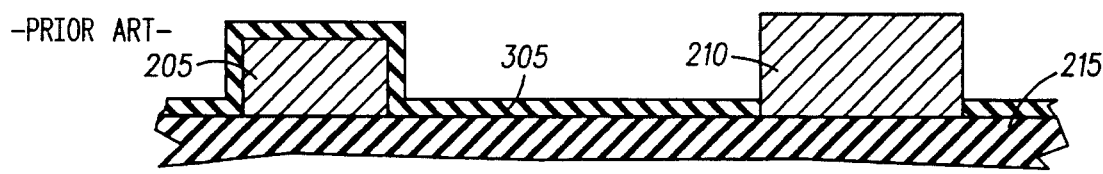

The prior art can be more fully described with reference to FIGS. 1–8. FIG. 1 is a flowchart of the conventional printed circuit fabrication process which is used to fabricate a printed circuit having solder locations for a direct chip attach (DCA) semiconductor chip. FIG. 2 illustrates a layer of insulating material 215 commonly referred to as a substrate, on which is formed a layer of metallization 205 and 210, typically copper, in a predetermined pattern. Forming a layer of metallization in a predetermined pattern on a substrate is known in the art, and a general description is provided in "Handbook of printed circuit manufacturing" by Raymond H. Clark. For a printed circuit for DCA, the predetermined pattern of the layer of metallization includes plating selected locations or solder locations which are patterned to reflect the bond pads of a semiconductor chip. Hence, to solder the bond pads of the semiconductor chip to the corresponding selected locations on the printed circuit, a measured amount of solder is required at each of the selected locations. A prior art method of forming the required amount of solder at each of the selected locations follows. With reference to FIG. 3, after the layer of metallization 205 and 210 are formed, the prior art process begins by forming 105 a layer of insulation commonly known as a solder mask 305, on the layer of metallization 205 and 210, and on the layer of insulation 215, in accordance with a predetermined solder mask pattern such that, selected locations 210 of the layer of metallization, are left uncovered by the solder mask 305.

The predetermined pattern of the layer of metallization 205 and 210 provides interconnects for an electronic circuit, and the selected locations 210 provide connections beyond the printed circuit. For example, the selected locations 210 can provide connections to components or connectors that may be mounted on the printed circuit. Conventionally, this is accomplished by soldering the leads of the components or connectors to the selected locations 210. The solder mask 305 insulates the layer of metallization 205 during the soldering process, hence, solder can only adhere to the selected locations 210. For solder to form and adhere to the selected locations 210, these locations must be plated with a layer of tin lead, and the following paragraph describes how this is accomplished.

Figure 4:
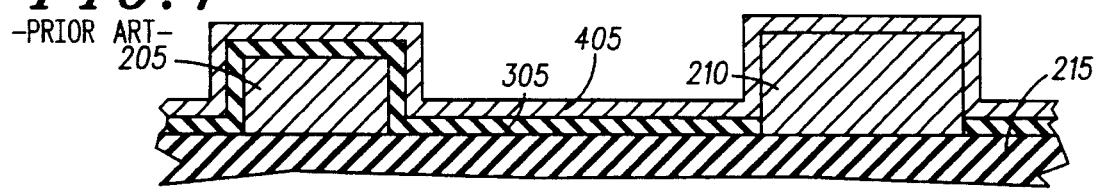
Figure 5:
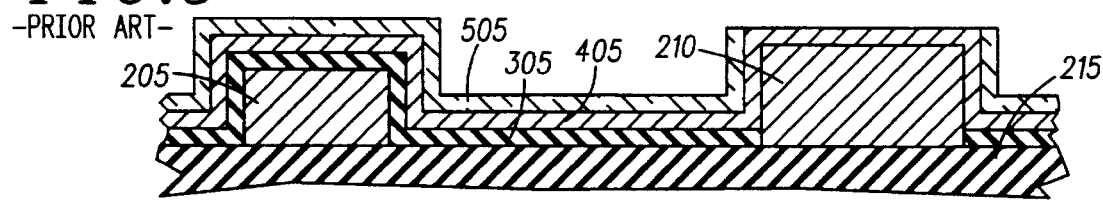
Figure 6:
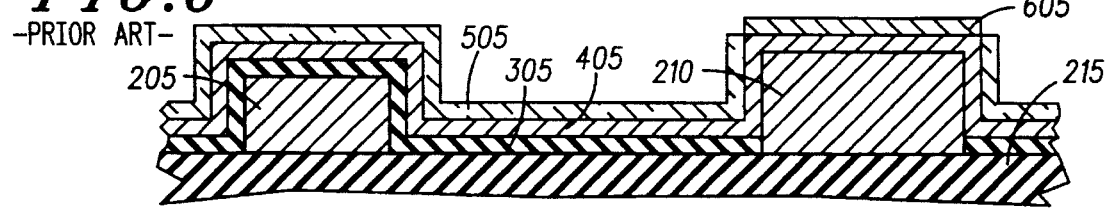

Plasma is applied 110 to the surface of the solder mask 305, and with reference to FIG. 4, a layer of metallization 405 is formed 115, in accordance with a corresponding one of a plurality of predetermined metallization patterns typically by catalytic action. Alternatively, KMNO$_4$, or both plasma and KMNO$_4$, may be applied to the surface of the solder mask 305. The layer of metallization 405, typically copper, forms a contiguous layer on the solder mask 305 and on the selected locations 210. In FIG. 5, a layer of plating resist 505 is formed 120 on the layer of metallization 405 in accordance with a plating resist pattern where the plating resist pattern is one of a plurality of predetermined patterns, and, where the selected locations 210 are not covered by the layer of plating resist 505. In FIG. 6 a layer of plating, typically tin lead plating 605, is formed 125 on the selected locations 210.

Plasma is used to roughen the surface of the solder mask 305, which improves the adhesion of the layer of metallization 405 to the surface of the solder mask 305. While the use of plasma is effective, it has several disadvantages. Primarily, roughening of the surface of the solder mask inherently degrades the solder mask making it susceptible to reliability problems. In addition, exposure of the solder mask to plasma has to be critically controlled to ensure that the plasma strips away only the required amount of the solder mask to produce the required degree of roughness. Another disadvantage of using plasma is its cost, as plasma is significantly more expensive than the other steps due to the materials and equipment required.

The contiguous layer of metallization 405 forms a bussing layer that provides an electrical plane that couples the selected locations 210 to form an electrode. The electrode typically is used for electrolytic action to form the layer of tin lead plating 605 on the selected locations 210.

Figure 7:
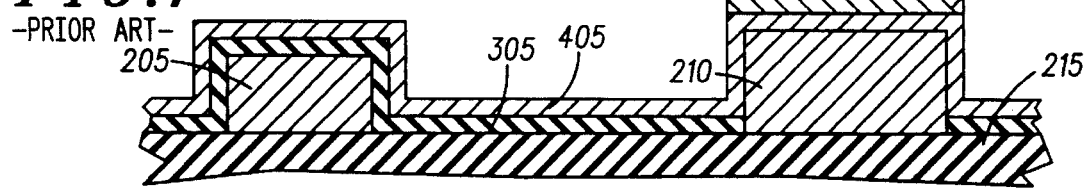
Figure 8:
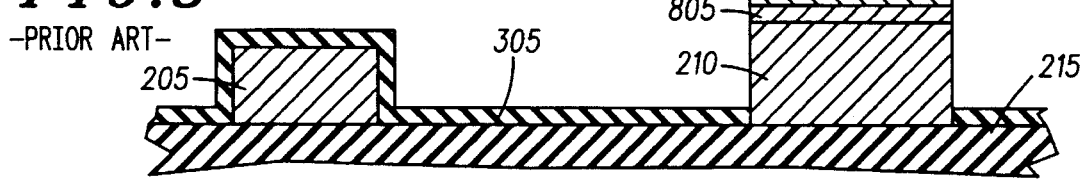

Having formed the layer of tin lead plating 605, the layer of plating resist 505 is stripped 125 off the layer of metallization 405 as depicted in FIG. 7, and subsequently the layer of metallization 405 is stripped 135 off the solder mask 305 as illustrated in FIG. 8. Subsequently, the printed circuit is reflowed and the tin-lead plating forms solder.

The layer of metallization 405 is stripped off the solder mask 305, typically by etching away the layer of copper 405. During etching, the etchant does not act on the selected locations 210 as these are plated with tin lead. However, where the copper 405 is etched off the solder mask 305, the solder mask 305 is exposed directly to the etchant, which further degrades the solder mask. For example, the etching entraps contaminants in the roughened surface of the solder mask, which substantially reduces the reliability of the solder mask.

Essentially, with this method the solder mask is formed prior to forming the layer of tin lead plating, hence, the solder mask is exposed to various processes that degrade the solder mask making the solder mask susceptible to reliability problems.

Figure 9:
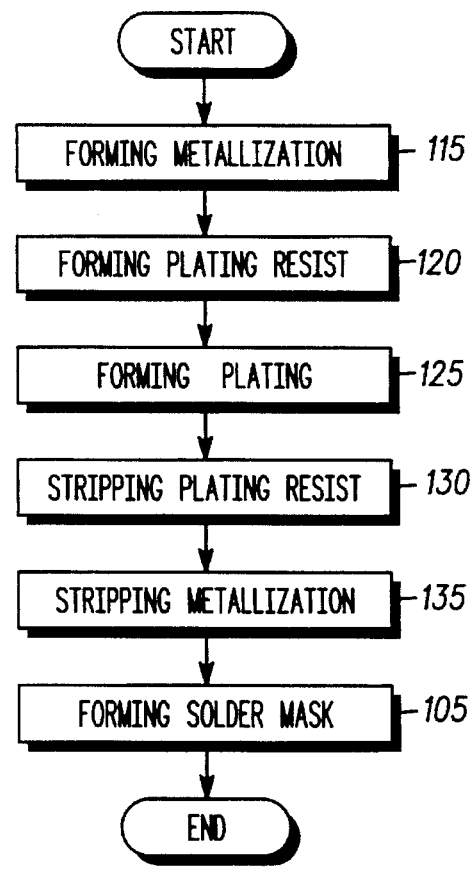
FIG. 9 illustrates a flowchart for fabricating a printed circuit in accordance with the present invention.
Figure 10:
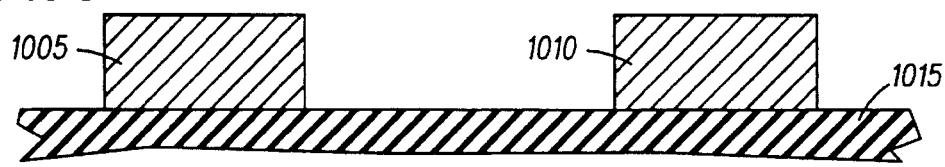
FIGS. 10–17 illustrate a cross sectional view of a printed circuit at various stages during fabrication in accordance with the present invention.
Figure 11:
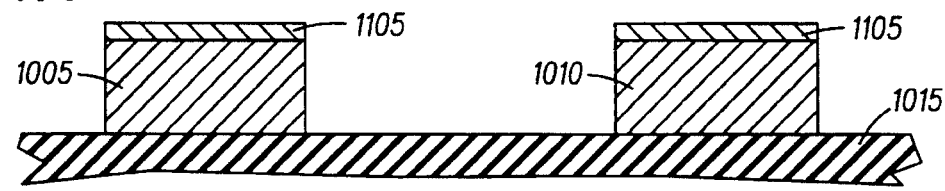

The present invention comprises forming a layer of plating at selected locations of a printed circuit, and subsequently, forming a solder mask. Hence, the present invention advantageously forms the solder mask after forming the layer of plating, thereby not exposing the solder mask to the step of forming the layer of plating, and avoiding degradation of the solder mask. The present invention can be more fully described with reference to FIGS. 9–17. FIG. 9 illustrates a flowchad for fabricating a printed circuit in accordance with the present invention. FIG. 10 illustrates a layer of metallization 1005 and 1010, typically copper, formed on a layer of insulating material 1015 or substrate, in a predetermined pattern. The layer of metallization 1005 and 1010 is the first of a plurality of layers of metallization. With reference to FIG. 11, this method begins by forming 115 a second of the plurality of layers of metallization 1105 on the layer of metallization 1005 and 1010 in accordance with the first of the plurality of predetermined patterns. The layer of metallization 1105, provides protection for the layer of metallization 1005 and 1010 during a later etching process. Forming the layer of metallization 1105 may include forming a layer of nickel and subsequently forming a layer of gold, where both layers may be individually formed by catalytic action. In the preferred embodiment, forming the layers of metallization comprises depositing the layers of metallization by a catalytic process. The deposition of nickel and gold maybe restricted to only the surface of the layer of metallization 1005 and 1010 by controlling the catalytic action. This catalytic action is significantly less critical, and as a result, is easier to control than that of plasma used in the prior art. The layer of nickel forms a preliminary layer on which to form the layer of gold, and the layer of nickel is essential to prevent the copper, of the metallization layer 1005 and 1010, from migrating to the layer of gold.

Figure 12:
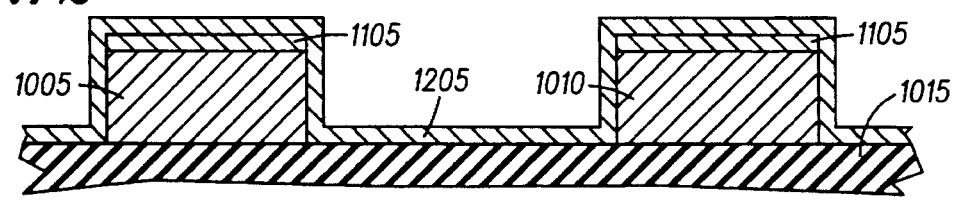
Figure 13:
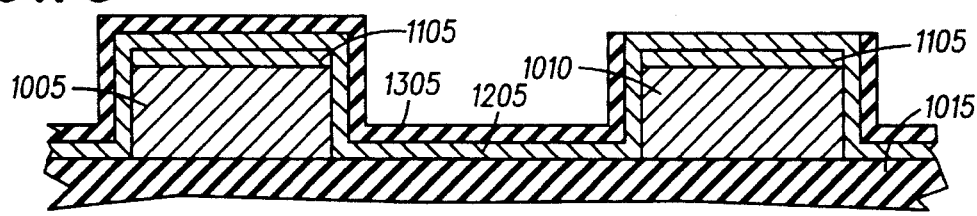
Figure 14:
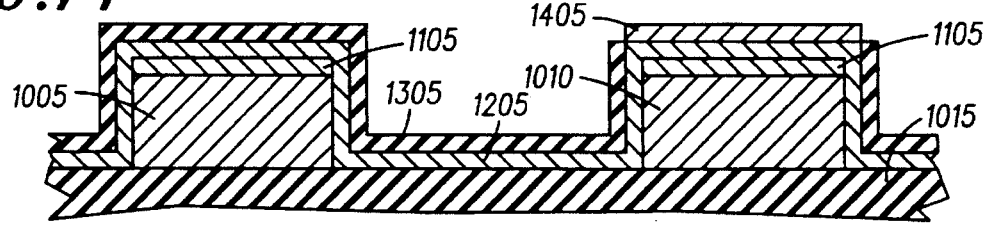
Figure 15:
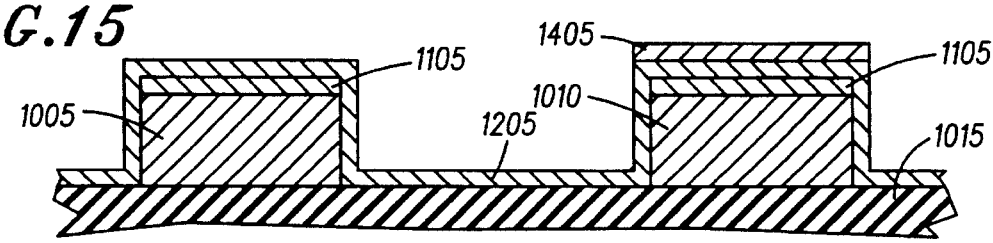
Figure 16:
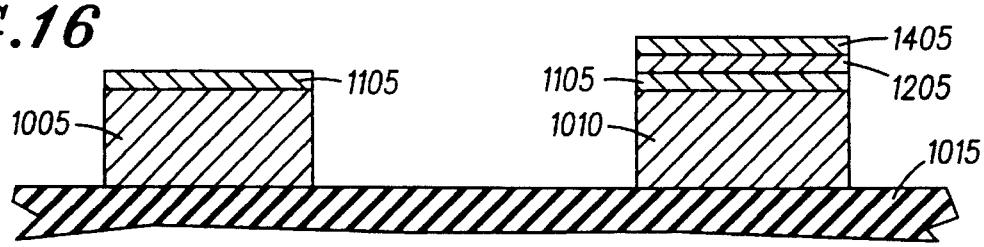
Figure 17:
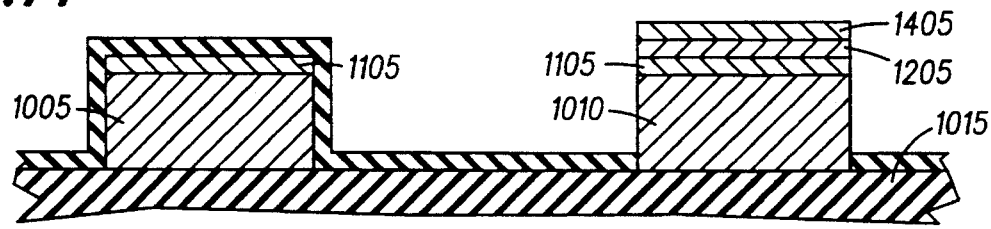

With reference to FIG. 12, further forming 115 a third of the plurality of layers of metallization 1205, for example by catalytic action, where the layer of metallization 1205, for example electroless copper, forms a contiguous layer on the layer of metallization 1105 and on the layer of insulation 1015. With reference to FIG. 13, forming 120 a second of the plurality of insulation layers, commonly referred to as a layer of plating resist 1305 in accordance with a second of the plurality of predetermined patterns referred to as a predetermined plating resist pattern, where selected locations 1010 are exposed or left covered by the layer of plating resist 1305. Thus, the layer of plating resist 1305, is formed on the layer of metallization 1205 except at the selected locations 1010. Next, as illustrated in FIG. 14, forming 125 a layer of plating, for example tin lead plating 1405, on the selected locations 1010. The layer of plating 1405 is the fourth of the plurality of metallization layers formed on the selected locations of the third of the plurality of layers of metallization, typically using an electrolytic deposition process. The third of the plurality of layers of metallization 1205, such as electroless copper, is used as an electrode during the electrolytic deposition process. Having formed the layer of tin lead plating 1405 on the selected locations 1010, stripping 130 the second of the plurality of insulation layers i.e. the layer of plating resist 1305 off the layer of metallization 1205 as illustrated in FIG. 15, and, subsequently stripping 135 the third of the plurality of metallization layers i.e. the layer of metallization 1205 of the layer metallization 1105 and off the layer of insulation 1015, as illustrated in FIG. 16. The layer of metallization 1205, typically of copper, is typically stripped by etching. The etchant strips the copper off the layer of insulation 1015 and off the layer of metallization 1105, however, the etchant leaves the selected locations that are tin plated, in tact. In addition, the etchant strips the layer of metallization 1205, typically copper, off the layer of metallization 1105, typically gold, without significantly affecting the layer of metallization 1105, as the etchant does not strip gold as efficiently as it strips copper. Finally, with reference to FIG. 17, forming 105 a third of the plurality of insulation layers in accordance with a third of the plurality of predetermined patterns comprising a layer of solder mask 1705 in accordance with a predetermined solder mask pattern, where only the selected locations 1010 that are plated 1405 are left by the solder mask 1705.

In accordance with the present invention, printed circuits for a DCA semiconductor chip can be fabricated by forming plating prior to forming a solder mask, which prevents unnecessary exposure of the solder mask to the plating process. In addition, as plasma is not used in the present invention, fabrication of printed circuits is more economical and the fabricated printed circuits are more reliable.

Thus, it can be seen that the present invention provides an economical and reliable method for fabricating printed circuits that are substantially more reliable.

What is claimed is:

1. A method for fabricating solder locations for a direct chip attach (DCA) semiconductor chip on a printed circuit when fabricating the printed circuit, wherein the method comprises the steps of:
   a) after forming a patterned layer of metallization on a substrate, forming at least three layers of plating at solder locations for a direct chip attach (DCA) semiconductor chip on the patterned layer of metallization; and
   b) thereafter, forming a layer of solder mask on the patterned layer of metallization and on the substrate, thereby not exposing the solder mask to the step (a) of forming the at least three layers of plating.

2. A method for fabricating solder locations for a direct chip attach (DCA) semiconductor chip on a printed circuit when fabricating the printed circuit, wherein the method comprises:
   a) after forming a patterned layer of metallization on a substrate sequentially forming a layer of plating at solder locations for a direct chip attach (DCA) semiconductor chip on the patterned layer of metallization, wherein forming the layer of plating comprises the step of sequentially forming layers of nickel, gold, copper and tin-lead on the patterned layer of metallization and on the substrate; and
   b) thereafter, forming a layer of solder mask on the patterned layer of metallization and on the substrate, thereby not exposing the solder mask to the step (a) of forming the layer of plating.

3. The method of claim 1 wherein step (a) comprises the step of depositing at least some of the plurality of layers of metallization by catalytic action.

4. A method for fabricating solder locations for a direct chip attach (DCA) semiconductor chip on at least one plane of a printed circuit, wherein the printed circuit comprises a first of a plurality of metallization layers, formed on a substrate in accordance with a first of a plurality of predetermined patterns, wherein the method comprises the steps of:
   a) forming a second of the plurality of metallization layers on the first of the plurality of metallization layers in accordance with the first of the plurality of predetermined patterns, wherein the second of the plurality of metallization layers protects the first of the plurality of metallization layers from subsequent steps;
   b) thereafter, forming a third of the plurality of metallization layers, wherein the third of the plurality of metallization layers forms a contiguous layer on the substrate and on the second of the plurality of metallization layers;
   c) thereafter, forming a layer of plating resist on the third of the plurality of metallization layers in accordance with a second of the plurality of predetermined patterns, wherein the layer of plating resist identifies the solder locations on the third of the plurality of metallization layers;
   d) thereafter, forming a fourth of the plurality of metallization layers on the solder locations on the third of the plurality of metallization layers;
   e) thereafter, removing the layer of plating resist off the third of the plurality of metallization layers;
   f) thereafter, removing the third of the plurality of metallization layers off the substrate and the second of the plurality of metallization layers; and
   g) thereafter, forming a solder mask in accordance with a third of the plurality of predetermined patterns, wherein the solder mask forms a contiguous layer on the substrate and the second of the plurality of metallization layers leaving the solder locations uncovered, thereby forming the solder locations for a direct chip attach (DCA) semiconductor chip without exposing the solder mask to steps (a) to (f).

5. The method of claim 4, wherein step (d) comprises the step of using the third of the plurality of metallization layers as an electrode for an electroplating process to form the fourth of the plurality of metallization layers on the selected locations of the third of the plurality of metallization layers.

6. A method for fabricating solder locations for a direct chip attach (DCA) semiconductor chip on a printed circuit comprising the steps of:
   a) forming at least three layers of metallization at solder locations for a direct chip attach (DCA) semiconductor chip in accordance with one of a plurality of predetermined patterns on a patterned layer of metallization formed on a substrate prior to step (a); and
   b) thereafter, forming a solder mask in accordance with another one of the plurality of predetermined patterns on the patterned layer of metallization and the substrate, thereby forming the at least three layers of metallization at the solder locations for a direct chip attach (DCA) semiconductor chip on the patterned layer of metallization without exposing the solder mask to the step of forming the at least three layers of metallization at the solder locations in step (a).

7. The method of claim 6, wherein step (a) comprises the steps of:
   depositing one of the at least three layers of metallization on the patterned layer of metallization and the substrate to facilitate forming another one of the at least three layers of metallization; and
   etching the deposited one of the at least three layers of metallization of the patterned layer of metallization and the substrate prior to forming the solder mask.

8. The method of claim 7 wherein the step of depositing the one of the at least three layers of metallization on the patterned layer of metallization and the substrate comprises the step of depositing the one of the at least three layers of metallization on the patterned layer of metallization and the substrate by catalytic action.

9. The method of claim 6 wherein step (a) comprises the step of depositing one of the at least three layers of metallization at the solder locations for a DCA semiconductor chip on another one of the at least three layers of metallization by electrolytic action.

10. The method of claim 9 wherein the step of depositing the one of the at least three layers of metallization at the solder locations for a DCA semiconductor chip on the another one of the at least three layers of metallization by electrolytic action comprises the step of depositing a layer of tin lead on a layer of copper by electrolytic action.

11. A method for fabricating solder locations for a direct chip attach (DCA) semiconductor chip on a printed circuit comprising the steps of:

a) forming a layer of plating at solder locations for a direct chip attach (DCA) semiconductor chip in accordance with one of a plurality of predetermined patterns on a patterned layer of metallization formed on a substrate prior to step (a), wherein step (a) comprises the steps of:

depositing a layer of metallization on the patterned layer of metallization and the substrate to facilitate forming the layer of plating;

forming a layer of plating resist that identifies the solder locations for a DCA semiconductor chip on the deposited layer of metallization;

thereafter, stripping the layer of plating resist off the deposited layer of metallization after forming the layer of plating at the solder locations for a DCA semiconductor chip on the deposited layer of metallization, and before etching the deposited layer of metallization off the patterned layer of metallization and the substrate; and etching the deposited layer of metallization off the patterned layer of metallization and the substrate prior to forming a solder mask; and b) thereafter, forming the solder mask in accordance with another one of the plurality of predetermined patterns on the patterned layer of metallization and the substrate, thereby forming plating at the solder locations for a direct chip attach (DCA) semiconductor chip on the patterned layer of metallization without exposing the solder mask to the step of forming the layer of plating at the solder locations in step 12. The method of claim 11 further comprising the step of using the deposited layer of metallization as an electrode for an electroplating process to form the layer of plating at the solder locations on the deposited layer of metallization.

13. A method for fabricating solder locations for a direct chip attach (DCA) semiconductor chip on a printed circuit comprising the steps of:

a) forming a layer of plating at solder locations for a direct chip attach (DCA) semiconductor chip in accordance with one of a plurality of predetermined patterns on a patterned layer of metallization formed on a substrate prior to step (a), wherein step (a) comprises the steps of:

depositing a layer of metallization on the patterned layer of metallization and the substrate to facilitate forming the layer of plating, wherein the step of depositing the layer of metallization on the patterned layer of metallization and the substrate comprises the steps of sequentially depositing layers of nickel, gold and copper; and etching the deposited layer of metallization off the patterned layer of metallization and the substrate prior to forming the solder mask; and b) thereafter, forming a solder mask in accordance with another one of the plurality of predetermined patterns on the patterned layer of metallization and the substrate, thereby forming plating at the solder locations for a direct chip attach (DCA) semiconductor chip on the patterned layer of metallization without exposing the solder mask to the step of forming the layer of plating at the solder locations in step 14. A method for fabricating a printed circuit having solder locations for a direct chip attach (DCA) semiconductor chip, wherein the method comprises the steps of:

a) depositing a first plurality of metallization layers to form a predetermined pattern of metallization;

b) thereafter, depositing a second plurality of metallization layers on the predetermined pattern of metallization to form at least three layers of plating at the solder locations thereon, wherein the step of depositing the second of the plurality of metallization layers includes the step of etching one of the at least three layers of plating; and c) thereafter, forming a solder mask on the predetermined pattern of metallization leaving the solder locations uncovered, thereby forming the solder locations for the direct chip attach (DCA) semiconductor chip without exposing the solder mask to step (b).

15. A method for fabricating a printed circuit having solder locations for a direct chip attach (DCA) semiconductor chip, wherein fabricating the printed circuit comprises the steps of depositing a first plurality of metallization layers to form a predetermined pattern of metallization on a substrate, forming a patterned solder mask on the predetermined pattern of metallization leaving the solder locations uncovered, and depositing plating at the uncovered solder locations, wherein the method comprises the steps of:

forming at least three layers of plating at the solder locations prior to forming the patterned solder mask on the predetermined pattern of metallization, but after forming the predetermined pattern of metallization on the substrate, thereby avoiding exposure of the solder mask to the formation of the at least three layers of plating.

* * * * *